United States Patent [19]
Barclay, Jr.

[11] Patent Number: 5,500,626
[45] Date of Patent: Mar. 19, 1996

[54] INDEPENDENT AMPLIFIER CONTROL MODULE

[75] Inventor: Clayton C. Barclay, Jr., Elkhart, Ind.

[73] Assignee: Crown International, Inc., Elkhart, Ind.

[21] Appl. No.: 320,450

[22] Filed: Oct. 11, 1994

[51] Int. Cl.$^6$ .................................................... H03G 3/30
[52] U.S. Cl. ............................................. 330/279; 330/2
[58] Field of Search .............................. 330/2, 129, 278, 330/279, 284, 289

[56] References Cited

U.S. PATENT DOCUMENTS

| | | | |
|---|---|---|---|
| 4,330,809 | 5/1982 | Stanley | 361/103 |
| 4,481,477 | 11/1984 | Wittig | 330/2 |
| 4,644,288 | 2/1987 | Stanley | 330/2 |
| 5,015,969 | 5/1991 | Barclay et al. | 330/284 |
| 5,194,822 | 3/1993 | Bureau et al. | 330/2 X |
| 5,309,517 | 5/1994 | Barclay | 381/119 |

OTHER PUBLICATIONS

Crown Advertisement on "Signs of Artificial intelligent Life".
Crown Advertisement on "Smart Amp", dated 1993.
Crown Brochure, "IQ System 2000" dated 1988.

*Primary Examiner*—Steven Mottola
*Attorney, Agent, or Firm*—Baker & Daniels

[57] ABSTRACT

The present invention involves an amplifier control module for an amplifier system including the addition of firmware to allow stand alone operation and to independently perform desirable functions to enhance amplifier and system operation. The system includes a Host computer connected through an interface device to the control module to send and receive serial data. An operator can set parameters and define control module responses with a Host computer. Once the parameters have been set, the control module can be severed from the system and will operate as a stand alone controller according to the firmware. The firmware includes instructions for implementing smooth output limiting (SOL), automatic standby, short detection, enhanced output device emulator protection (ODEP) conservation, and interrupt driven reporting.

24 Claims, 3 Drawing Sheets

INDEPENDENT AMPLIFIER CONTROL MODULE

APPENDIX

This application includes a Smart Amp source code appendix having 71 pages. A portion of the disclosure of this patent document contains material which is the subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

The field of the invention relates to audio control system components and more particularly to amplifier control modules capable of interfacing with an operating system. One design interfaces a Host computer with an amplifier control module using an operating system for sending and receiving serial data. The control module collects data and sends it to the operating system which monitors the data and, according to the associated programming, sends instructions back to the control module for implementation. In this system, the control module cannot operate independently from the Host computer. Instead, the control module monitors key circuits and sends data through the interface and up to the Host computer. The Host computer then processes the data and sends instructions through the interface and down to the control module.

One of the functions of the above described system relates to monitoring the audio amplifier input vs. output to determine if there is distortion in the signal. This function is achieved as follows: 1) an amplifier's input and output are measured by an input/output comparator (IOC) circuit, 2) the resulting signal is communicated to the control module, 3) the control module sends the data to a system interface device by an output line driver, 4) the serial data is then passed along a system communication bus, 5) through an interface, and 6) into a computer where the data is processed and then sent back to the control module along the previously described path in reverse order.

Accordingly, a great deal of control is lost if the communication bus is severed between the control module and the operating system.

SUMMARY OF THE INVENTION

The invention relates generally to amplifier controls and specifically to microprocessor based control modules ("Smart-Amps") having firmware for supporting effective stand alone operation and being capable of interfacing with an operating system for downloading operator selected function parameters from a Host computer. The firmware residing in the Smart-Amp includes instructions for implementing smooth output limiting, automatic standby, short detection, enhanced Output Device Emulator Protection (ODEP) conservation, and interrupt driven reporting. While the firmware resides within the Smart-Amps, parameters associated with the firmware is downloaded to the Smart-Amp control module by an operating system in conjunction with the Host computer. The operating system used to interface with the invention is disclosed in U.S. Pat. No. 5,015,969 issued May 14, 1991, assigned to the assignee of the present invention, the disclosure of which is incorporated herein by reference.

The Smart-Amp includes a microprocessor which monitors the amplifier's junction temperature simulation (JTS) circuit for Output Device Emulator Protection (ODEP) conservation, an input/output comparator (IOC Fault Detection), rail voltage, and the audio signal at the input and output stages and which provides smooth output limiting, automatic standby, interrupt driven reporting, short detection and ODEP conservation. The Smart-Amp operates in two modes, ASA (Auto System Algos) stand alone mode and interface mode. In the ASA mode, the Smart-Amp processes the collected data via firmware in conjunction with operator selected parameters and directly controls its attached amplifier accordingly. In the interface mode, the Smart-Amp operates as described in the above referenced patent: "The module, under command of the Host computer, uses common user input technology and has the ability to turn an audio channel of the amplifier on or off, adjust the level of the digital attenuators, invert the audio signal polarity and turn an auxiliary control line on or off."

One advantage of the invention involves having on-board firmware for processing commands and providing key operational functions, such as smooth output limiter function, automatic standby, fault reporting, short detection, ODEP conservation, and automatic patching. The Smart-Amp can thereby continue to operate in a stand-alone manner when the interface bus is severed.

Accordingly, it is an object of this invention to provide novel amplifier control module firmware sufficient for stand-alone operation.

Another object of this invention is to provide amplifier control firmware having a smooth output limiting function to gradually attenuate input signals which exceed the threshold parameter without changing signal dynamics.

Another object of this invention is to provide amplifier control firmware having an automatic standby function which quietly turns off the amplifier's power supplies until incoming signals go above the adjustable threshold parameter.

Another object of this invention is to provide amplifier control firmware that allows an operator to define error conditions so that upon such occurrence, the module sends a report to the operating system, such as a fault output.

Another object of this invention is to provide amplifier control firmware having a short detection function such that an operator can define normal/shorted loudspeaker load parameters and instruct the control module how to act thereon, including automatically patching on backup systems.

Another object of this invention is to provide amplifier control firmware having an improved ODEP conservation protection which smoothly attenuates the input drive signal when the amplifier's thermal capabilities are approached or exceeded.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

The preferred embodiment herein described is not intended to be exhaustive or to limit the application to the precise forms disclosed rather it is chosen and described to enable others skilled in the art to utilize its teachings.

Figure 1:
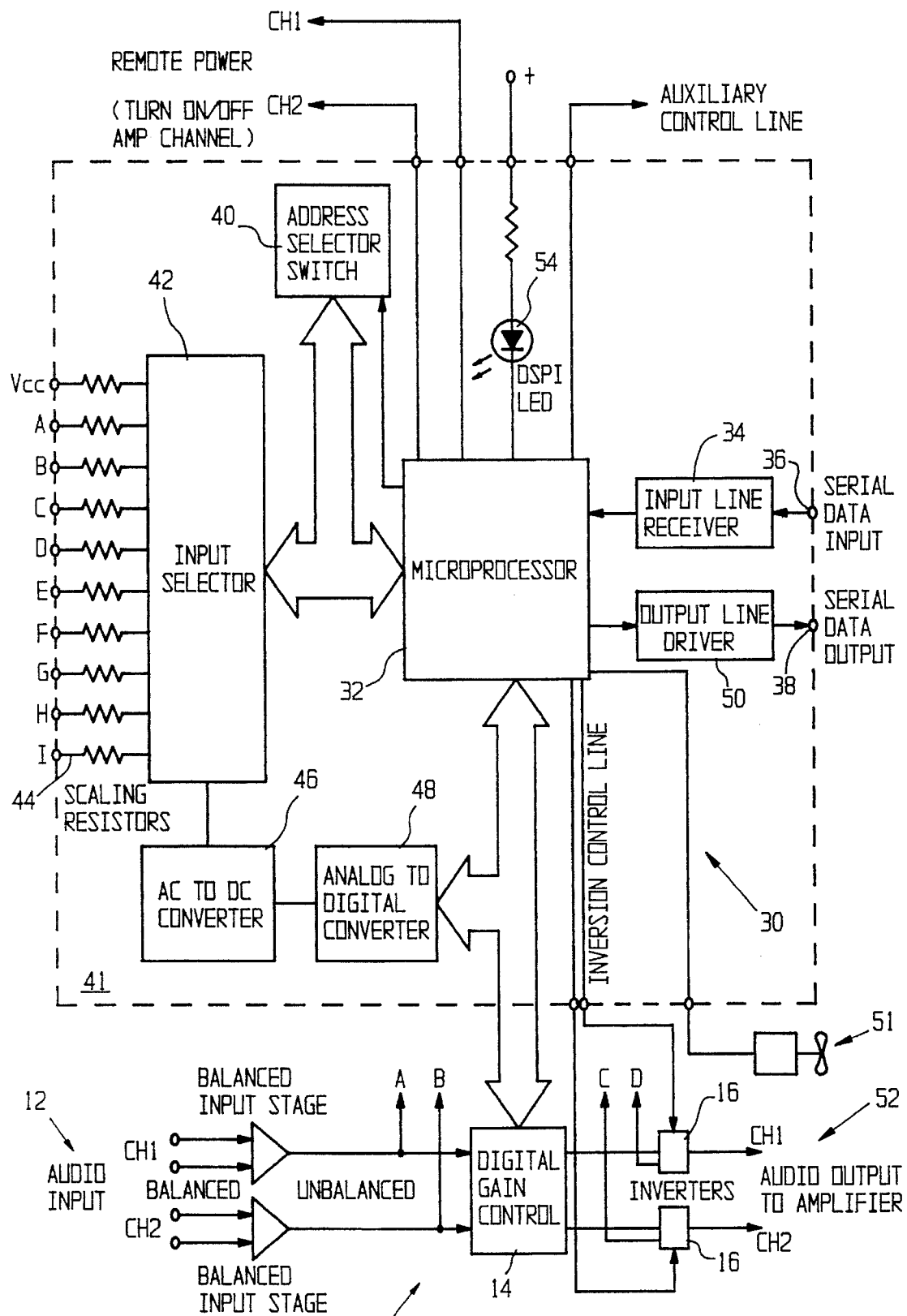
FIG. 1 is a block diagram of the Smart-Amp control module of this invention interconnected to an audio amplifier.
Figure 2:
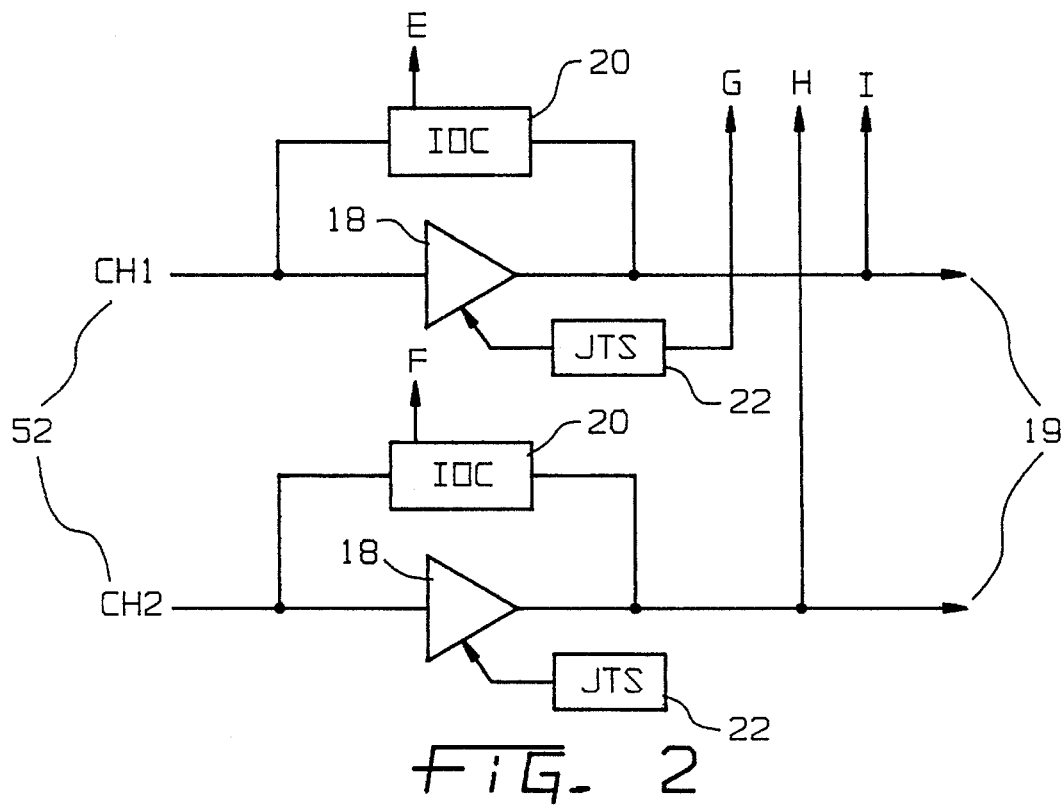
FIG. 2 is a block diagram of the amplifier portion of an audio amplifier interconnected to an input/output comparator circuit and a junction temperature simulation circuit.

A common power amplifier 11 is shown in FIGS. 1 and 2. Audio input terminals 12 connect to digital gain control 14. The outputs of the digital gain control are connected to the inputs of inverters 16. Audio amplifier 11 is connected to Smart-Amp control module 30 as detailed below. The outputs of the inverters are audio output channels 52 and are connected to the audio amplifier circuit of FIG. 2.

The audio amplifier circuit of FIG. 2 includes: audio amplifiers 18, junction temperature simulation (JTS) circuits 22, and input/output comparators (IOC) 20. The outputs of invertor circuits 16 are connected to inputs 52 (CH1 and CH2) of amplifiers 18. The outputs of amplifiers 18 are connected to audio output terminals 19. IOC's 20 are respectively connected to the inputs and outputs of amplifiers 18. JTS circuits 22 are respectively connected to amplifiers 18 to monitor the input and output audio signal. A more complete and thorough description of the JTS circuit is disclosed in U.S. Pat. No. 4,330,809 issued May 18, 1982, assigned to the assignee of the present invention, the disclosure of which is incorporated herein by reference. Electrical conductors connect audio inputs 12, digital gain control 14, inverters 16, IOC's 20, JTS's 22 and audio outputs 20 to a common socket (not shown) for accommodating an edge connector of the Smart-Amp.

As detailed in the block diagram of FIG. 1, Smart-Amp amplifier control module 30 includes microprocessor 32, serial data input and output connectors 36, 38, input/output line receiver/driver 34,50, address selector switch 40, input selector 42, AC to DC converter 46, analog to digital converter 48 and digital signal presence indication (DSPI) light 54. Input line receiver 34 is interconnected between serial data input terminal 36 and the serial input lead of microprocessor 32. Similarly, output line driver 50 is interconnected between serial data output connector 38 and the serial output lead of microprocessor 32. Eight bit DIP switch 40 is connected by a databus to the input lines of the microprocessor to provide address information. Input selector 42 is connected between the input lines of the microprocessor and a plurality of edge connector terminals 44 having scaling resistors. AC to DC converter 46 is connected between the output of the selector and the inputs of analog to digital converter 48. The outputs of the analog to digital converter are connected via a bus connector to a plurality of input leads to the microprocessor.

The Smart-Amp is arranged on a single printed circuit board 41 which includes edge connector 44 of known design for easy installation into any amplifier having an appropriate mating edge connector socket, such as found in Com-Tech (TM) and Macro-Tech (TM) type amplifiers as sold by Crown International, Inc. of Elkhart, Ind. (Com-Tech and Macro-Tech are trademarks of Crown International, Inc.)

Figure 4:
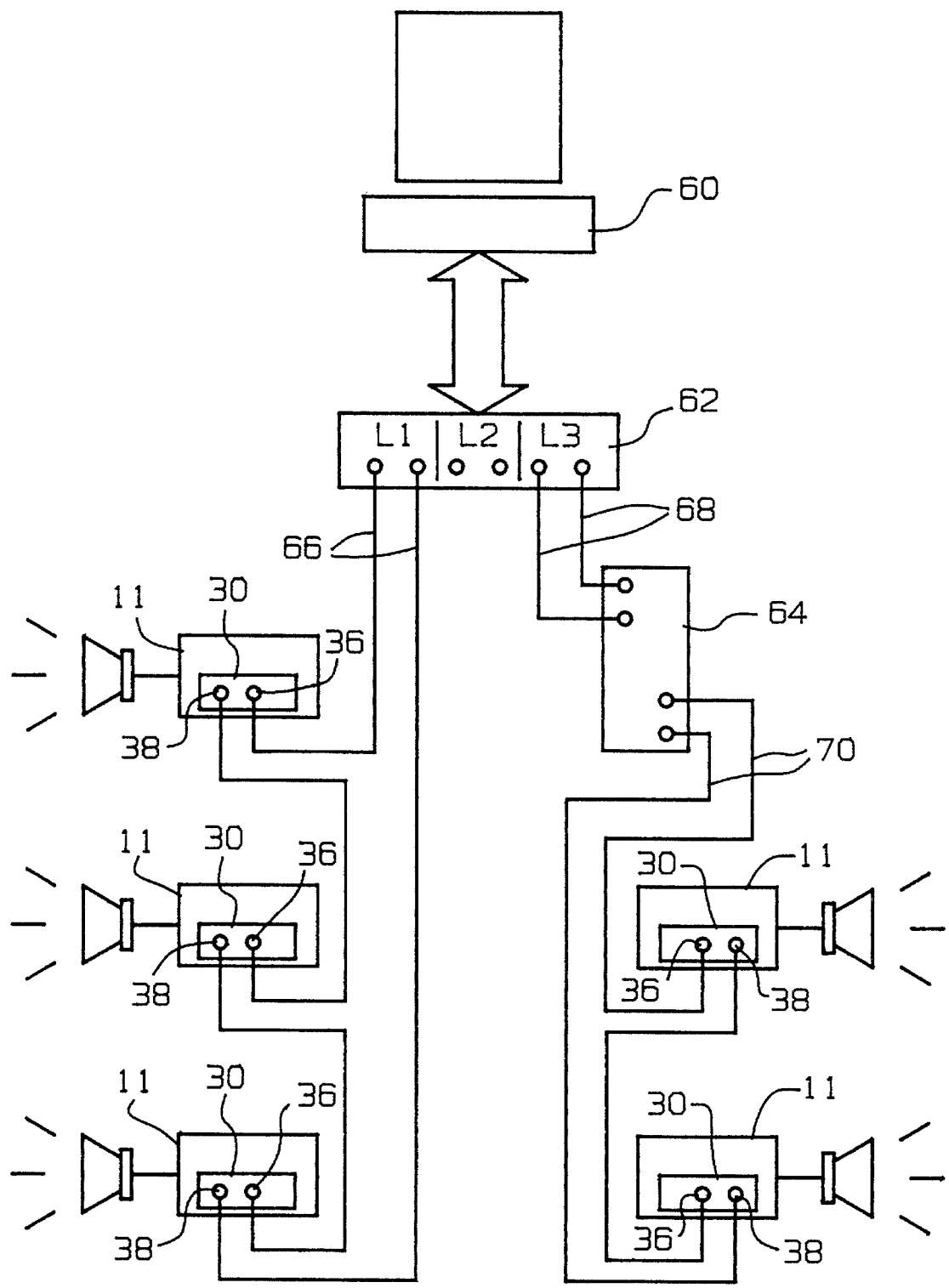
FIG. 4 is a block diagram of an amplifier control system utilizing the Smart Amp control module of FIG. 1.

The Smart-Amp may operate two or more modes, including ASA (Auto System Algos) stand alone mode and interface mode. Referring to FIG. 4, the interface mode Smart=Amps 30, installed in amplifiers 11, send and receive data to and from Host computer 60 via interface 62, or in the alternative through Drone 64, through serial data inputs 36 and outputs 38 via communications buses 66, 68, and 70. In this mode of operation, an operator can manipulate any of the Smart-Amps parameters, stored in volatile memory, associated with the resident instructions. However, the operator cannot manipulate the resident instructions themselves, as they are stored in nonvolatile memory, and are referred to as "firmware".

In each ASA mode, the Smart-Amp 30 processes the collected data via firmware and, in conjunction with operator selected parameters, controls the attached amplifier accordingly. Several algorithms are encoded in the microprocessor's firmware. These routines are not downloaded from an interface component, such as Host computer 60 or Drone 64, but rather reside within the Smart-Amp. Parameters are downloaded from Host computer 60 or from Drone 64 so as to give the resident algorithms some operating guidelines. The firmware processes commands and provides key operational functions, such as smooth output limiter function, automatic standby, fault reporting, short detection, output device emulator protection (ODEP) conservation, and automatic patching. The Smart-Amp can thereby continue to operate in a stand-alone mode when the interface bus 66, 68 and 70 is severed.

ODEP conservation, a known concept, is refined and enhanced in the firmware of the present invention. The JTS circuits disclosed in the Stanley '809 patent are thermal protection circuits which clamp the drive completely at a certain level (100%), which in turn limits the audio signal and results in distortion.

In the present invention, JTS data is input into the input selector and follows a path through the ac/dc converter, the A/D converter, and into the microprocessor. The microprocessor reads the data and determines if the pre-defined ODEP "trigger" level (%) has been exceeded. When the trigger level is exceeded then the algorithm adjusts the gain of the amplifier according to the pre-defined rate of attenuation (0.25, 0.5, 1, ..., 5 dB). This gives the Smart-Amp the added flexibility of balancing the thermodynamic reserve of the amplifier with input gain based upon the JTS.

For example, if the trigger level of 50% is exceeded, the digital gain control lowers the attenuation by five dB every 30 seconds. The firmware constructs a JTS model and does not necessarily negate the occurrence of hard clipping, but rather only when the thermal stability is compromised and the connected loudspeaker is in risk of damage. This limits the thermodynamic risk to the amplifier but also allows it to operate in a desirable and effective manner.

In addition, the ODEP routine independently controls the speed/operation amplifier internal fan 51 for heat removal. As the ODEP % rises, the internal fan velocity is increased. For example, as the trigger level of 50% is exceeded fan 51 is energized, for every 5% over the trigger level the current to the fan is increased by a set amount and the velocity is increased by a corresponding percentage depending upon the type of equipment used.

Smooth output limiting (SOL) is another added feature to the Smart-Amp. SOL provides a gradual attenuation of input signals which exceed a desired level. When the adjustable threshold is exceeded, the gain is "quietly" decreased without changing signal dynamics. In the field of audio amplification, "quietly" is a term of art which refers to the gradual attenuation of a signal upon the occurrence of a certain condition. For example, if the input signal exceeds the input threshold by 5%, then the amplifier gain is reduced by five dB every 20 seconds until the differential drops below the 5% threshold. By quietly reducing the gain to a signal, the listener is less likely to notice the change in volume.

SOL interacts with ODEP so that if the SOL threshold is exceeded prior to reaching the ODEP threshold, then the SOL routines have priority. Conversely, where the ODEP trigger level is exceeded prior to reaching the SOL threshold, then the ODEP routines have priority. When the two overlap, i.e., control goes back and forth, the firmware maintains gain control by "mixing" the SOL and ODEP routine commands. The SOL and ODEP signals are monitored, summed and compared so that if both algorithms are calling for 5 dB of attenuation, then instead of the firmware calling for a total of 10 dB of attenuation, the firmware will only call for the needed 5 dB of attenuation. This prevents undesirable overshooting resulting in unnecessary gain attenuation.

Figure 3:
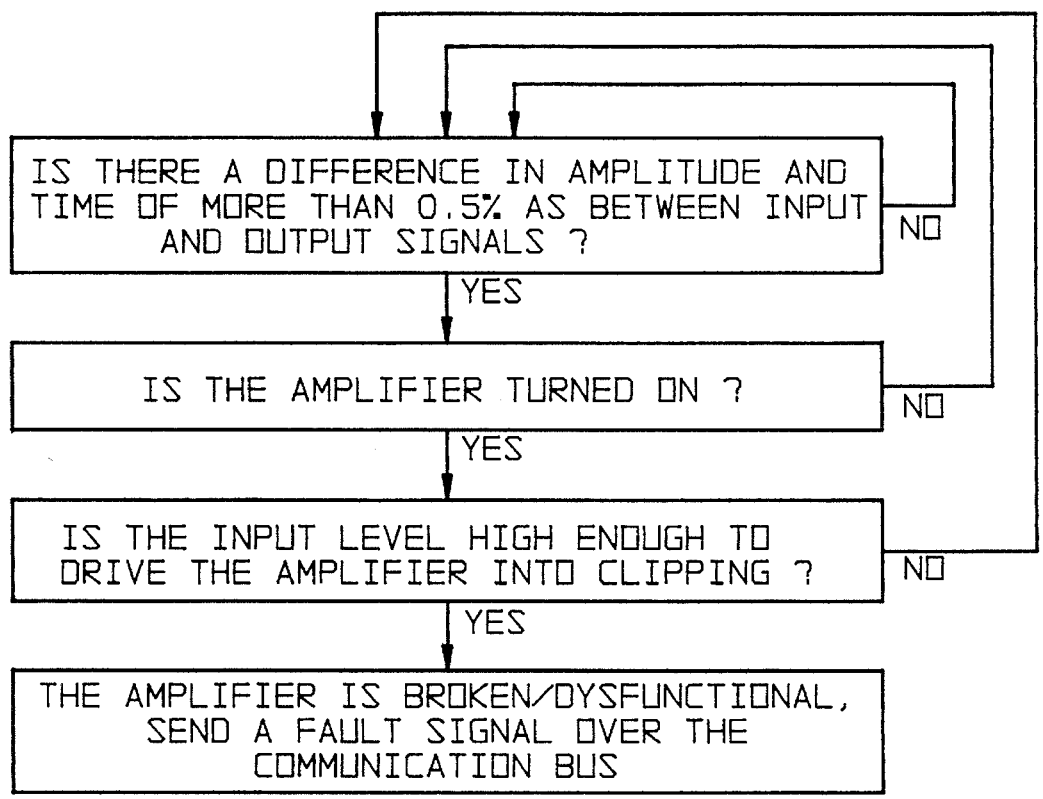
FIG. 3 is a flow chart representation of the firmware resident in the present invention Smart-Amp relating to the input/output comparator control function.

The firmware includes an input/output comparator (IOC) algorithm as shown in the flow chart of FIG. 3. The IOC circuit, by differential evaluation, measures the input signal against the output signal. When there is a difference in amplitude and time of more than 0.05%, the IOC circuit, in conjunction with the associated firmware, interprets this as a sign that the amplifier is dysfunctional and causes a "fault" message to be sent out on the communication bus. The fault message above will not be sent if the amplifier has been turned off, since this would prevent the amplifier from being able to reproduce the input signal to the output signal. In addition, the fault signal will only be enabled if the input level is high enough to drive the amplifier into a clipping range.

Another added feature is automatic standby (AS). This allows the Smart-Amp to quietly shut off an amplifier's power supplies when no incoming signal, or at least not the requisite level, is observed. When an incoming signal goes above the adjustable threshold, then the algorithm brings the power supplies back on line, and the amplifier operates as programmed.

Short detection (SD) is an algorithm which protects loudspeakers from damage but also prevents unnecessary outages. An operator defines conditions that represent normal and shorted loudspeaker loads and prescribes the necessary remedial actions. The Smart-Amp, upon observing the pre-defined circumstance indicating a shorted condition, energizes a relay via the auxiliary output to bring on-line a back-up loudspeaker. This provides automatic patching into back-up systems, thereby preventing downtime and outages during concerts, ballgames, or other events.

The Host computer can be an appropriately programmed Macintosh, such as recommended with the Crown IQ 2000 System. Also, any appropriately programmed computer cold be used, including the programmable controller as disclosed in U.S. patent application entitled "Programmable Central Intelligence Controller and Distributed Intelligence Network for Analog/Digital Control Systems" filed on even date herewith It is to be understood that the invention is not to be limited to the precise form disclosed but rather may be modified within the scope of the appended claims.

What is claimed is:

1. An amplifier control unit for controlling the operation of an amplifier in conjunction with a computer, said amplifier control unit comprising:

conversion means for converting an analog signal from the amplifier to a digital signal;

communications means for transmitting a signal to the computer;

processor means for generating control signals for the amplifier, said processor means connected to said conversion means and said communications means; and a program stored in a memory accessible by said processor means, said program including a plurality of instructions for said processor to generate said control signals responsive to said digital signals from said conversion means, said program including instructions for operation of said amplifier control unit in a stand alone mode of operation independent of said computer.

2. The amplifier control unit of claim 1 further comprising current means for converting alternating current to direct current, said current means connected to said conversion means and adapted for connection to the amplifier.

3. The amplifier control unit of claim 1 further comprising selector means coupled to said conversion means and having a plurality of inputs adapted for connection to a plurality of amplifiers, said selector means for specifying which of said inputs are directed to said conversion means.

4. The amplifier control unit of claim 1 further comprising output means for transmitting signals from said processor to the computer.

5. The amplifier control unit of claim 1 wherein said program includes instructions to determine if said digital signals from said conversion means exceed a predetermined level and to send an error signal in response.

6. The amplifier control unit of claim 1 wherein said program includes instructions to determine if said digital signals from said conversion means exceed a predetermined level and to increase the speed of a fan on the amplifier in response.

7. The amplifier control unit of claim 1 wherein said program includes instructions to determine if said digital signals from said conversion means exceed a predetermined level and to decrease the gain of said amplifier in response.

8. The amplifier control unit of claim 1 wherein said program includes instructions to determine if said digital signals from said conversion means exceed a predetermined level and to shut off the amplifier in response.

9. The amplifier control of claim 1 further including a circuit board with a plurality of connections said circuit board mounting said conversion means, said communicating means, said processor means, and said memory.

10. The amplifier control of claim 1 wherein said program includes an ODEP plurality of instructions for detecting a trigger level in the output of the amplifier and attenuating said control signals in response to a detected trigger level.

11. The amplifier control of claim 10 wherein said program includes a plurality of instructions for detecting a trigger level in the input of the amplifier and attenuating said control signals in response to a detected trigger level.

12. The amplifier control of claim 11 wherein said program includes a plurality of instructions for mixing the attenuation of said ODEP instructions and said SOL instructions.

13. An amplifier system including:

a computer including a display and an interface unit;

an amplifier; and a control unit connected to said interface unit, said control unit including conversion means for converting an analog signal from said amplifier to a digital signal, communications means for transmitting a signal to said computer, processor means for generating control signals for said amplifier, said processor means connected to said conversion means and said communications means, and a program stored in a memory accessible by said processor means, said program including instructions for said processor to generate said control signals responsive to said digital signals from said conversion means, said program including instructions for operation of said amplifier control unit in a stand alone mode of operation independent of said computer.

14. The amplifier system of claim 13 further comprising a second amplifier connected to said conversion means, said conversion means including selector means coupled to said conversion means and having a plurality of inputs connected to said amplifiers, said selector means for specifying which of said inputs are directed to said conversion means.

15. The amplifier system of claim 14 further comprising a second control unit, said interface unit including addressing means for communicating with a specified one of said control units.

16. The amplifier system of claim 13 wherein said program includes instructions to determine if said digital signals from said conversion means exceed a predetermined level and to send an error signal in response.

17. The amplifier system of claim 13 wherein said program includes instructions to determine if said digital signals from said conversion means exceed a predetermined level and to increase the speed of a fan on the amplifier in response.

18. The amplifier system of claim 13 wherein said program includes instructions to determine if said digital signals from said conversion means exceed a predetermined level and to decrease the gain of said amplifier in response.

19. The amplifier system of claim 13 wherein said program includes instructions to determine if said digital signals from said conversion means exceed a predetermined level and to shut off the amplifier in response.

20. The amplifier system of claim 13 wherein said program includes parameters for use in generating said control signals, and said computer includes means for changing said parameters of said program.

21. A method of operating an amplifier system including a computer, an amplifier control unit, and an amplifier, said method including the steps of:

providing a program in a memory of the amplifier control unit, said program including instructions for operating the amplifier control unit in a stand alone mode of operation independent of the computer;

sending parameters to the amplifier control unit, the parameters specifying acceptable operating conditions of the amplifier;

after receiving the parameters in the previous step, monitoring the operating condition of and controlling the amplifier with the control unit independently of the computer;

determining with the control unit if the monitored operating conditions of the amplifier are acceptable according to the parameters; and sending a fault signal to the computer if an unacceptable operating condition is detected.

22. The method of claim 20 wherein said determining step includes comparing the monitored operating condition of the amplifier with a predetermined level.

23. The method of claim 20 wherein said determining step includes ascertaining if the amplifier is operative.

24. The method of claim 20 wherein said determining step includes comparing the monitored operating condition of the amplifier with a clipping level.

* * * * *